(12) United States Patent
Chen et al.

(10) Patent No.: US 12,417,968 B2
(45) Date of Patent: Sep. 16, 2025

(54) PACKAGE STRUCTURE AND FORMING METHOD THEREOF

(71) Applicant: Taiwan Semiconductor Manufacturing Company, Ltd., Hsinchu (TW)

(72) Inventors: Chin-Liang Chen, Kaohsiung (TW); Chi-Yang Yu, Taoyuan (TW); Yu-Min Liang, Taoyuan (TW); Hao-Cheng Hou, Hsinchu (TW); Jung-Wei Cheng, Hsinchu (TW); Tsung-Ding Wang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 533 days.

(21) Appl. No.: 17/880,686

(22) Filed: Aug. 4, 2022

(65) Prior Publication Data

US 2024/0047322 A1   Feb. 8, 2024

(51) Int. Cl.
*H01L 23/48* (2006.01)
*H01L 21/48* (2006.01)
(Continued)

(52) U.S. Cl.
CPC .... *H01L 23/49816* (2013.01); *H01L 21/4853* (2013.01); *H01L 21/4857* (2013.01);
(Continued)

(58) Field of Classification Search
None
See application file for complete search history.

(56) References Cited

U.S. PATENT DOCUMENTS

| | | | |
|---|---|---|---|
| 8,372,741 B1* | 2/2013 | Co | H01L 25/0657 219/56.22 |
| 2009/0001612 A1* | 1/2009 | Song | H01L 23/3128 257/E23.116 |
| 2013/0049208 A1* | 2/2013 | Cho | H01L 25/03 257/773 |

(Continued)

FOREIGN PATENT DOCUMENTS

| | | |
|---|---|---|
| TW | 201717296 | 5/2017 |
| TW | 202129860 | 8/2021 |
| TW | I765778 | 5/2022 |

OTHER PUBLICATIONS

"Office Action of Taiwan Counterpart Application", issued on Sep. 22, 2023, p. 1-p. 10.

Primary Examiner — Nicholas J Tobergte
(74) Attorney, Agent, or Firm — JCIPRNET

(57) ABSTRACT

A package structure and a manufacturing method thereof are provided. The package structure includes an integrated substrate and a package component. The integrated substrate includes a substrate component laterally covered by an insulating encapsulation, a redistribution structure disposed over the substrate component and the insulating encapsulation, first conductive joints coupling the redistribution structure to the substrate component, and a buffer layer disposed on a lowermost dielectric layer of the redistribution structure and extending downwardly to cover an upper portion of each of the first conductive joints. A lower portion of each of the first conductive joints connected to the upper portion is covered by the insulating encapsulation. The package component disposed over and electrically coupled to the redistribution structure includes a semiconductor die laterally covered by an encapsulant.

20 Claims, 13 Drawing Sheets

(51) Int. Cl.
   *H01L 23/00*  (2006.01)
   *H01L 23/498* (2006.01)
   *H01L 25/065* (2023.01)

(52) U.S. Cl.
   CPC ...... *H01L 21/486* (2013.01); *H01L 23/49822* (2013.01); *H01L 23/49833* (2013.01); *H01L 23/49838* (2013.01); *H01L 24/16* (2013.01); *H01L 24/32* (2013.01); *H01L 24/73* (2013.01); *H01L 25/0655* (2013.01); *H01L 2224/16227* (2013.01); *H01L 2224/16238* (2013.01); *H01L 2224/32225* (2013.01); *H01L 2224/73204* (2013.01); *H01L 2924/3512* (2013.01); *H01L 2924/37001* (2013.01)

(56) References Cited

U.S. PATENT DOCUMENTS

| | | | |
|---|---|---|---|
| 2013/0056871 A1* | 3/2013 | Yu | H05K 1/181 |
| | | | 257/E23.101 |
| 2013/0075922 A1* | 3/2013 | Huang | H01L 23/49816 |
| | | | 438/126 |
| 2013/0075926 A1* | 3/2013 | Bae | H01L 25/105 |
| | | | 438/126 |
| 2013/0234317 A1* | 9/2013 | Chen | H01L 25/50 |
| | | | 257/E21.511 |
| 2014/0264840 A1* | 9/2014 | Lin | H01L 25/105 |
| | | | 257/737 |
| 2016/0260684 A1* | 9/2016 | Zhai | H01L 25/0652 |
| 2021/0202389 A1* | 7/2021 | Hsieh | H01L 24/96 |
| 2022/0230967 A1* | 7/2022 | Park | H01L 23/3128 |
| 2023/0015721 A1* | 1/2023 | Chia | H01L 21/568 |

* cited by examiner

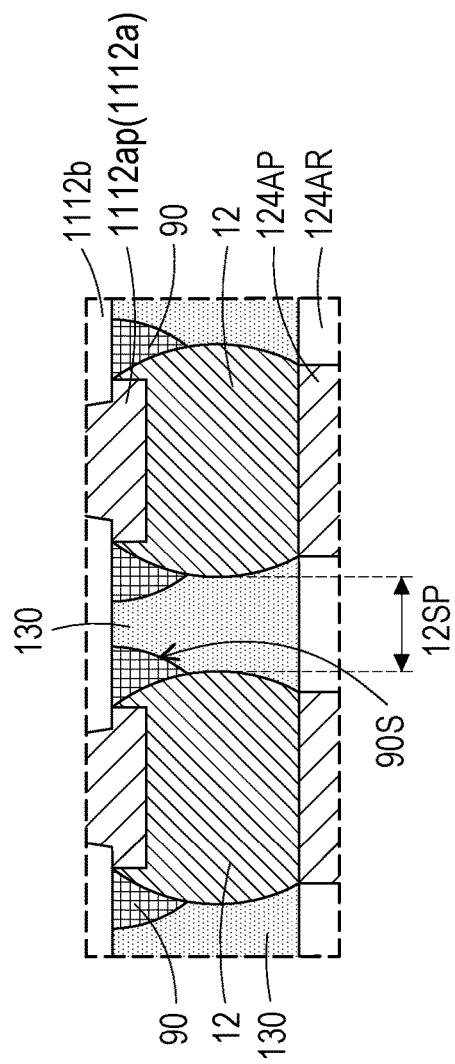
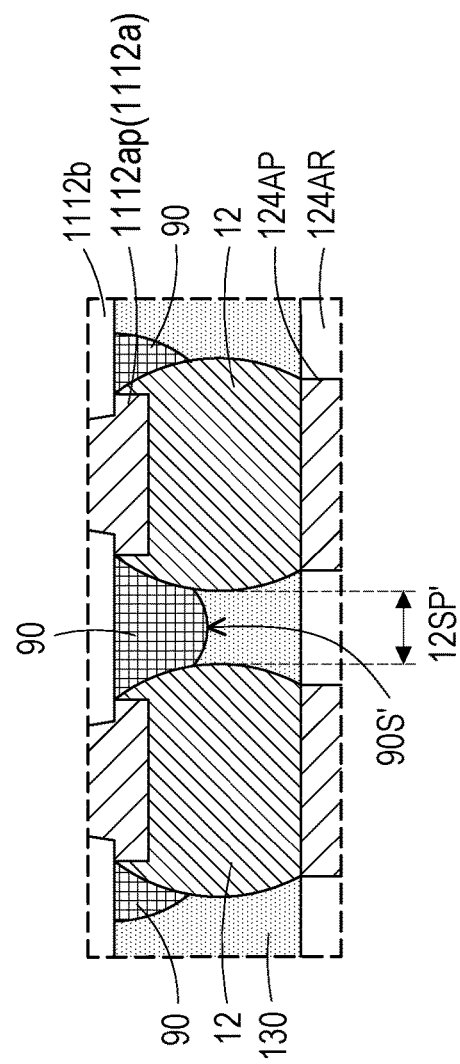

PACKAGE STRUCTURE AND FORMING METHOD THEREOF

BACKGROUND

Contemporary high performance computing systems consisting of one or more electronic devices have become widely used in a variety of advanced electronic applications. When integrated circuit components or semiconductor chips are packaged for these applications, one or more chip packages are generally bonded to a circuit carrier (e.g., a system board, a printed circuit board, or the like) for electrical connections to other external devices or electronic components. To respond to the increasing demand for miniaturization, higher speed, and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A-8B are schematic and enlarged cross-sectional views of variations of the structure outlined in the dashed box A of FIG. 7, in accordance with some embodiments.

DETAILED DESCRIPTION

Figure 1A:
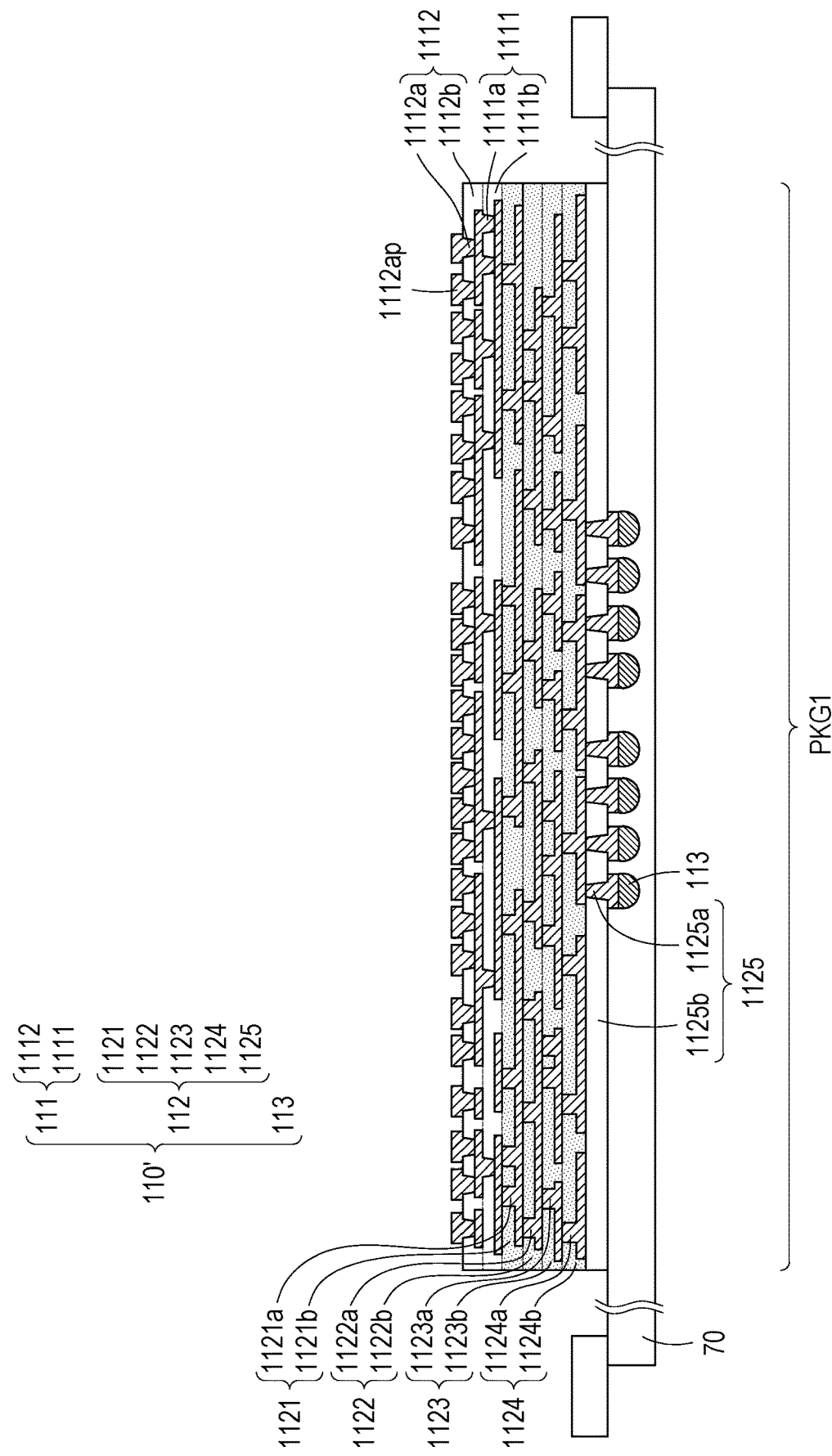
FIGS. 1A, 2A, 3A, 4A, 5A, 6, and 7 are schematic cross-sectional views of various stages of a manufacturing method of a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

High-performance computing (HPC) has become more popular and being widely used in advanced networking and server applications, especially for artificial intelligence related products that require high data rate, increasing bandwidth and for lowering latency. The embodiments disclosed herein can meet super high bandwidth requirements for HPC applications combined with system on integrated substrate (SoIS) solutions. As such, excellent electrical performance such as, signal integrity and power integrity are achievable in a low-cost packaged structure.

FIGS. 1A, 2A, 3A, 4A, 5A, 6, and 7 are schematic cross-sectional views of various stages of a manufacturing method of a package structure, and FIGS. 1B, 2B, 3B-3D, 4B, and 5B are schematic top views of structures at various stages respectively corresponding to FIGS. 1A, 2A, 3A, 4A, 5A, in accordance with some embodiments.

Referring to FIGS. 1A, a redistribution structure 110' may be disposed on a tape frame 70. In some embodiments, the redistribution structure 110' includes a first portion 111, a second portion 112 underlying the first portion 111, and bump portions 113 underlying the second portion 112. The bump portions 113 (and the lowest sublayers of the second portion 112) may be attached onto the tape frame 70. In some embodiments, the formation of the redistribution structure 110' includes: forming the second portion 112 on a first temporary carrier (not shown); forming the first portion 111 on the second portion 112 over the first temporary carrier; flipping over the structure and placing on a second temporary carrier (not shown); de-bonding the first temporary carrier to accessibly reveal the second portion 112; forming the bump portions 113 on the outermost layer of the second portion 112; flipping over the structure and placing on the tape frame 70; and de-bonding the second temporary carrier to accessibly reveal the first portion 111 for further processing.

In some embodiments, the formation of the redistribution structure 110' includes: forming the first portion 111 on a first temporary carrier (not shown); flipping over the structure and placing on a second temporary carrier (not shown); forming the second portion 112 on the first portion over the second temporary carrier; forming the bump portions 113 on the second portion 112; flipping over the structure and placing on the tape frame 70; and de-bonding the second temporary carrier to accessibly reveal the first portion 111 for further processing. In alternative embodiments, the formation of the redistribution structure 110' includes: sequentially forming the second portion 112 and the bump portions 113 on a temporary carrier (not shown); flipping over the structure and placing on the tape frame 70; de-bonding the temporary carrier to accessibly reveal the second portion 112; forming the first portion 111 on the second portion 112. The disclosure is not limited thereto. Other sequences or methods of forming the redistribution structure 110' are fully intended to be included within the scope of the disclosure.

With continued reference to FIG. 1A, the first portion 111 may include a first layer 1111 and a second layer 1112 overlying the first layer 111. The first layer 1111 may include a conductive pattern 1111a and a dielectric layer 1111b covering the conductive pattern 1111a, and the second layer 1112 includes a conductive pattern 1112a and a dielectric layer 1112b covering the conductive pattern 1112a, where the conductive pattern 1112a is in physical and electrical contact with the underlying conductive pattern 1111a, and the dielectric layer 1112b overlies the dielectric layer 1111b. For example, each of the conductive patterns (1111a and 1112a) includes conductive vias, conductive pads, conductive lines, and/or the like, and may include suitable conductive material(s) such as copper, titanium, tungsten, aluminum, alloy, a combination thereof, and/or the like. The conductive vias in the conductive patterns (1111a and 1112a) may be tapered toward the same direction from the second layer 1112 to the first layer 1111. In some embodiments, the conductive pads 1112ap of the conductive pattern 1112a are formed on the top surface of the dielectric layer 1112b for further electrical connection.

The dielectric layers (1111b and 1112b) may include a polymer (e.g., polybenzoxazole (PBO), benzocyclobutene (BCB), polyimide, or the like), a nitride, an oxide, an epoxy, a resin, a combination thereof, and/or the like, and may be formed by coating, lamination, or any suitable deposition process. In some embodiments, the dielectric layers (1111b and 1112b) are of the same material, and no visible interface is formed therebetween. Alternatively, the materials of the dielectric layers (1111b and 1112b) are different, and thus a visible interface is formed therebetween. Although the first portion 111 is shown as an example having two layers (1111 and 1112), more (or fewer) layers may be formed in the first portion 111.

With continued reference to FIG. 1A, the second portion 112 may include a first layer 1121 underlying the first layer 1111 of the first portion 111. The second portion 112 may further include a second layer 1122, a third layer 1123, a fourth layer 1124, and a fifth layer 1125 sequentially underlying the first layer 1121. Although the second portion 112 is shown as an example having five layers (1121-1125), more (or fewer) layers may be formed in the second portion 112. The first layer 1121, the second layer 1122, the third layer 1123, the fourth layer 1124, and the fifth layer 1125 may respectively include a conductive pattern (1121a, 1122a, 1123a, 1124a, and 1125a) and a dielectric layer (1121b, 122b, 1123b, 1124b, and 1125b) covering the corresponding conductive pattern (1121a, 1122a, 1123a, 1124a, and 1125a). The conductive patterns (1121a, 1122a, 1123a, 1124a, and 1125a) may interconnect one another, and the dielectric layers (1121b, 1122b, 1123b, 1124b, and 1125b) may be stacked upon one another. The conductive pattern 1121a of the first layer 1121 may be in physical and electrical contact with the overlying conductive pattern 1111a in the first portion 111 and the underlying conductive pattern 1122a of the second layer 1122, and the dielectric layer 1121b underlies the dielectric layer 1111b of the first portion 111 and overlies the dielectric layer 1122b of the second layer 1122.

The material(s) of the conductive patterns in the second portion 112 may be the same as (or similar to) that of the conductive patterns in the first portion 111. In some embodiments, the pattern density per unit area of the conductive patterns in the first portion 111 is denser than the pattern density per unit area of the conductive patterns in the second portion 112. The material(s) of the dielectric layers in the second portion 112 may (or may not) be different from that of the dielectric layers in the first portion 111. In some embodiments, one or more the dielectric layers (1121b, 1122b, 1123b, and/or 1124b) in the second portion 112 may be more rigid than dielectric layers in the first portion 111. The dielectric layer 1125b and the overlying dielectric layers of the second portion 112 may (or may not) be of the same material, depending on the process requirements.

In some embodiments, the dielectric layers (1121b, 1122b, 1123b, and 1124b) in the second portion 112 are formed by lamination or the like, and the conductive vias of the conductive patterns in the second portion 112 are formed by drilling openings in the dielectric layers and plating conductive material(s) in the openings. The conductive vias of the conductive patterns (1121a, 1122a, 1123a, and 1124a) in the second portion 112 may each have substantially vertical sidewalls. Alternatively, the dielectric layers (1121b, 1122b, 1123b, and 1124b) are formed by coating, lithography, and etching, etc., and the conductive vias of the conductive patterns formed in these dielectric layers may have a tapered profile. In some embodiments, the dielectric layer 1125b of the fifth layer 1125 is formed by coating, lithography, and etching, etc., and the conductive vias of the conductive pattern 1125a formed in the dielectric layer 1125b may have a tapered profile tapering toward the overlying fourth layer 1124. For example, the conductive vias of the conductive pattern 1125a in the second portion 112 and the conductive vias of the conductive patterns (1111a and 1112a) in the first portion 111 are tapered in opposing directions.

Still referring to FIG. 1A, the bump portions 113 formed on the fifth layer 1125 may have a different material than the overlying conductive patterns in the second portion 112. For example, the bump portions 113 include a conductive material such as solder, copper, aluminum, gold, nickel, silver, palladium, tin, the like, or a combination thereof. The bump portions 113 may be formed by: forming a layer of solder on the conductive pads of the conductive pattern 1125a through evaporation, electroplating, printing, solder transfer, ball placement, or the like; and performing a reflow process to shape the solder material into the desired bump shapes. The bump portions 113 may be (or include) ball grid array (BGA) connectors, solder balls, controlled collapse chip connection (C4) bumps, micro bumps, electroless nickel-electroless palladium-immersion gold (ENEPIG) bumps, and/or the like.

Figure 1B:
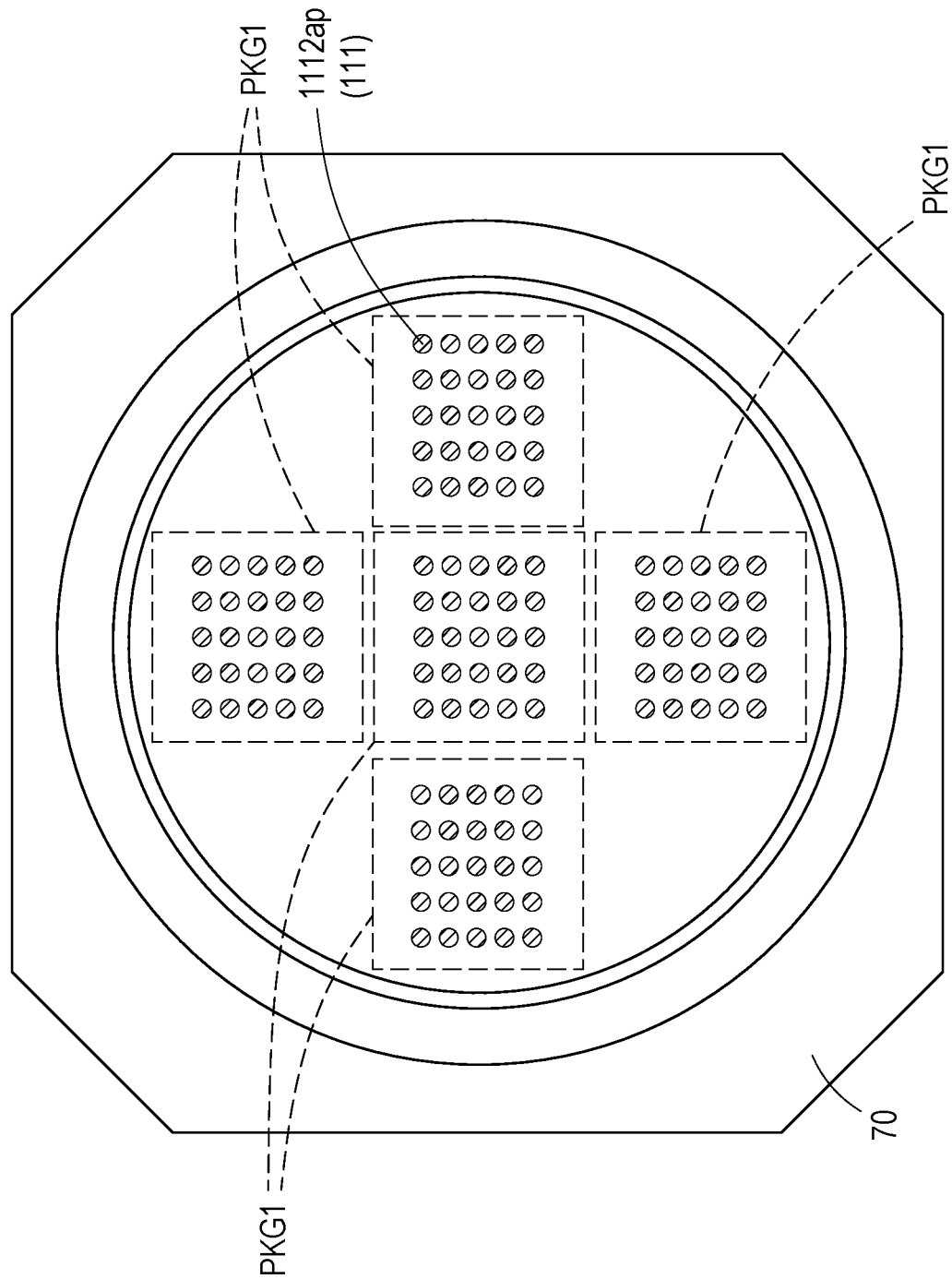
FIGS. 1B, 2B, 3B-3D, 4B, and 5B are schematic top views of structures at various stages respectively corresponding to FIGS. 1A, 2A, 3A, 4A, 5A, in accordance with some embodiments.

Referring to FIG. 1B and with reference to FIG. 1A, the cross-sectional view of FIG. 1A shows only one package region PKG1 for simplicity; in some embodiments, a plurality of package regions PKG1 may be disposed side-by-side on the tape frame 70 as shown in the top view of FIG. 1B. These package regions PKG1 may be simultaneously formed. Although five package regions are illustrated, more (or fewer) package regions may be arranged on the tape frame, depending on process requirements. In addition, although a wafer-form tape frame is illustrated, the discussed processes may be performed on a tape frame having a panel-form (or other form). In the illustrated embodiment, top-view shapes of the conductive pads 1112ap of the first portion 111 are circles. In alternative embodiments, the top-view shapes of the conductive pads 1112ap may be ovals, polygons (e.g., triangles, rectangles, hexagons), irregular shapes, or the like. It should be understood that the number and the configuration of the conductive pads 1112ap illustrate herein are merely examples and construe no limitation in the disclosure.

Figure 2A:
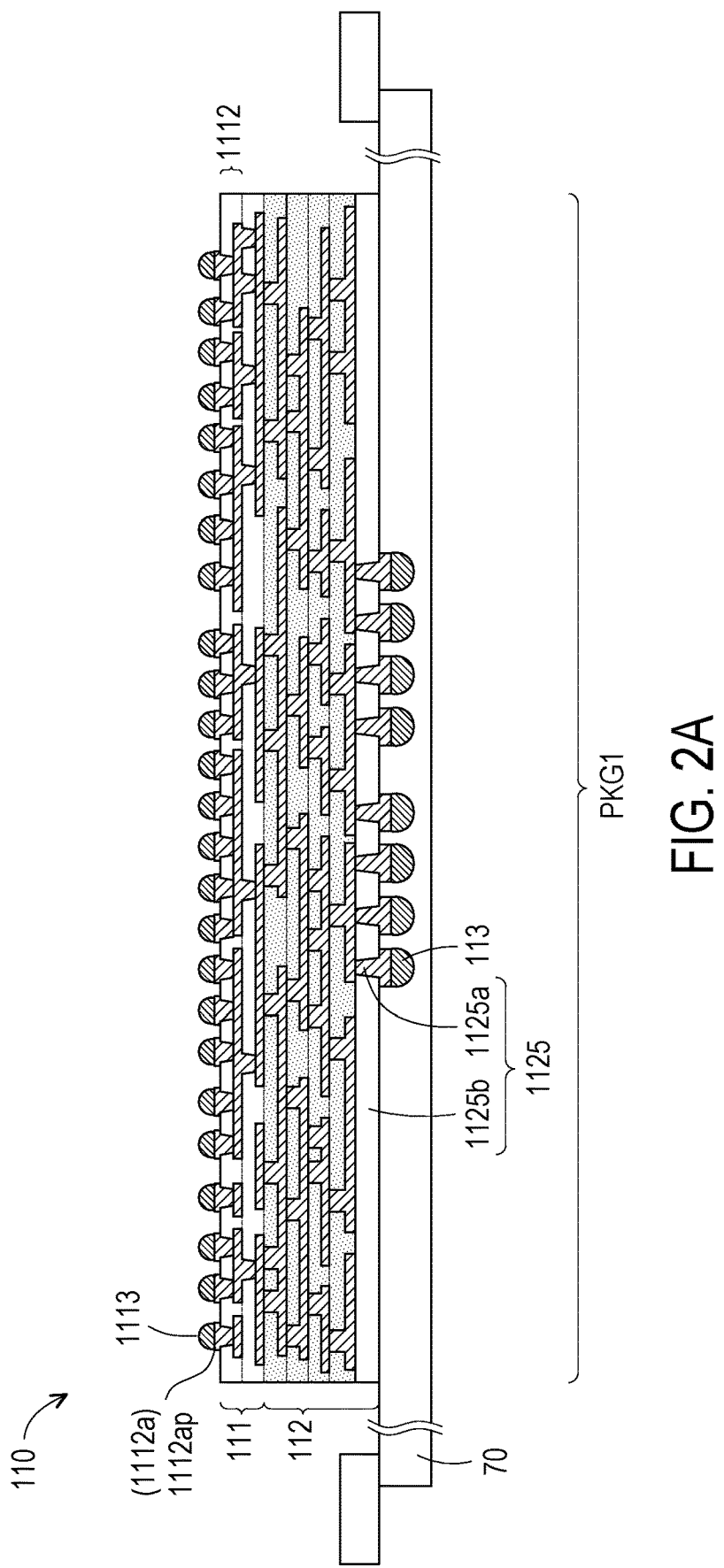

Referring to FIG. 2A and with reference to FIG. 1A, the redistribution structure 110 may further include bump portions 1113 formed on the conductive pattern 1112a of the second layer 1112 of the first portion 111. For example, the bump portions 1113 and the bump portion 113 are of the same (or similar) material. The bump portions 1113 may be formed by: forming a layer of solder on the respective conductive pad 1112ap of the conductive pattern 1112a through evaporation, electroplating, printing, solder transfer, ball placement, and/or the like; and performing a reflow process to shape the solder material into the desired bump shapes. The bump portions 1113 may be (or include) BGA connectors, solder balls, C4 bumps, micro bumps, ENEPIG bumps, and/or the like.

Figure 2B:
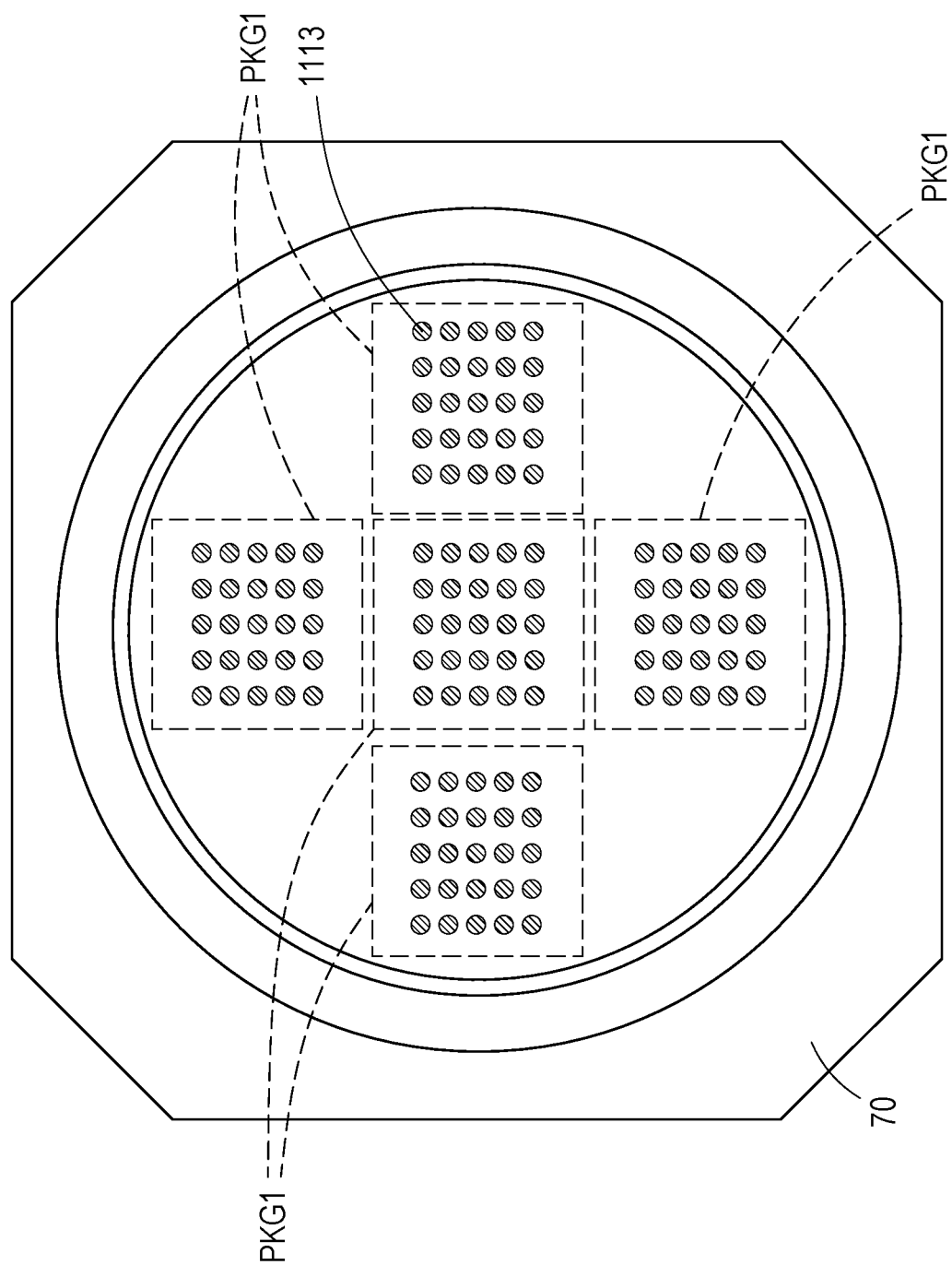

Referring to FIG. 2B and with reference to FIG. 2A, each of the bump portions 1113 may be formed on one of the conductive pads 1112ap. In the illustrated embodiment, top-view shapes of the bump portions 1113 are circles; however, other shapes of the bump portions 1113 are fully intended to be included within the scope of the disclosure. It should be understood that the number and the configuration of the bump portions 1113 illustrate herein are merely examples and construe no limitation in the disclosure.

Figure 3A:
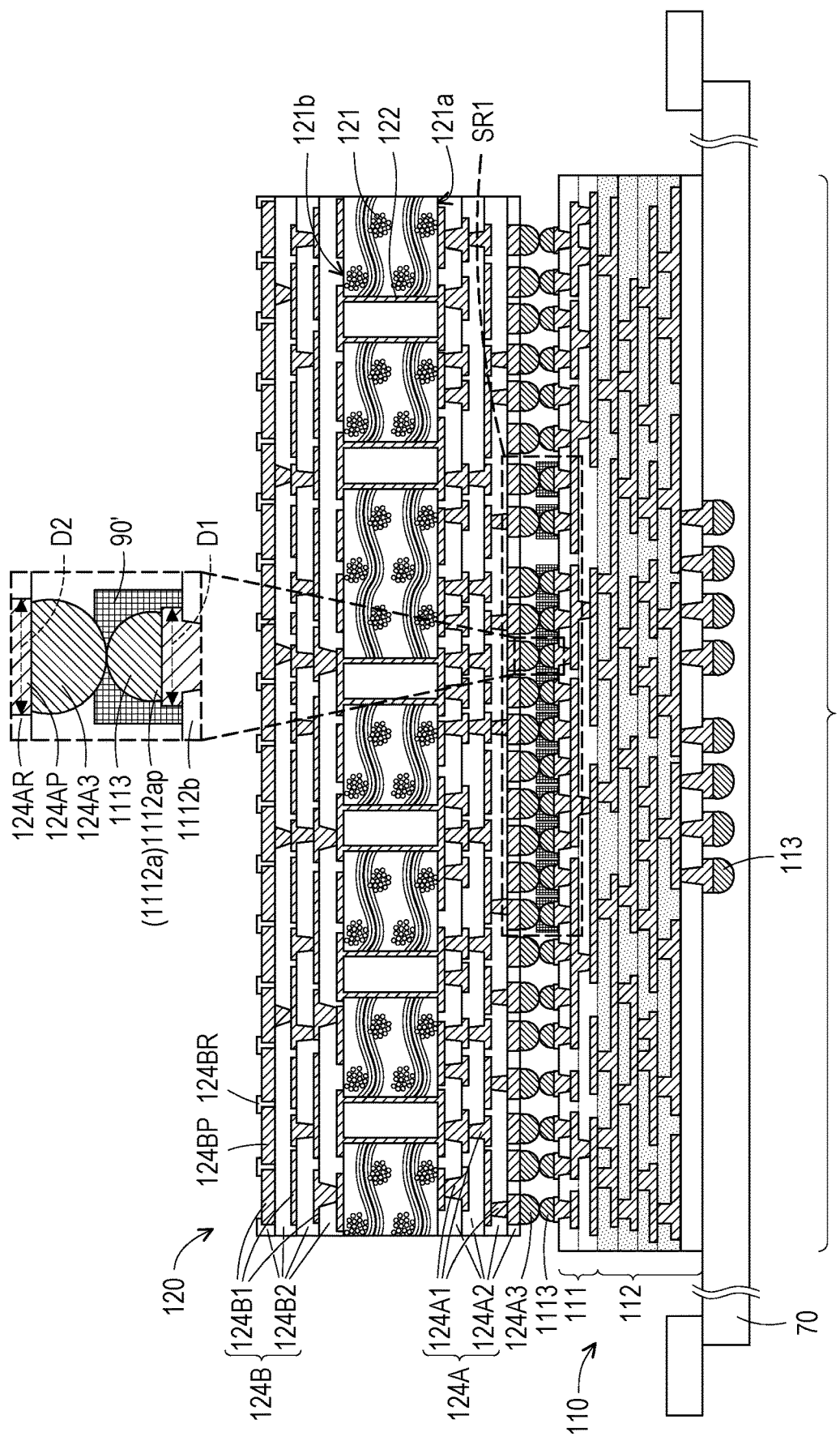

Referring to FIG. 3A, a substrate component 120 is provided. The substrate component 120 may be (or include) an organic substrate, a ceramic substrate, a silicon substrate, or the like. The substrate component 120 may include active and passive devices (not shown), or may be free from either active devices, passive devices, or both. Utilizing the substrate component 120 has the advantage of having the substrate component 120 being manufactured in a separate process. In some embodiments, because the substrate component 120 is formed in a separate process, the substrate component 120 may be individually or batch tested, validated, and/or verified prior to coupling the substrate component 120 to the redistribution structure 110. Before being coupled to the redistribution structure 110, the substrate component 120 may be processed according to applicable manufacturing processes to form redistribution structures in the substrate component 120.

In some embodiments, the substrate component 120 is a core substrate which includes a core layer 121. The core layer 121 may be formed of organic and/or inorganic materials. For example, the core layer 121 includes one or more layers of glass fiber, resin, filler, prepreg, epoxy, silica filler, Ajinomoto Buildup Film (ABF), polyimide, molding compound, other materials, and/or combinations thereof. In some embodiments, the core layer 121 includes one or more passive components (not shown) embedded therein. The core layer 121 may include other materials or components. Alternatively, the substrate component 120 is a coreless substrate. The substrate component 120 may include through core vias 122 extending through the core layer 121 for providing vertical electrical connections between two opposing sides (121a and 121b) of the core layer 121. In some embodiments, the through core vias 122 are hollow through vias having centers that are filled with an insulating material. In some embodiments, the through core vias 122 are solid conductive pillars.

With continued reference to FIG. 3A, the substrate component 120 includes a first build-up structure 124A and a second build-up structure 124B electrically coupled to each other through the through core vias 122, and fan-in/fan-out electrical signals. In some embodiment, the formation of the first build-up structure 124A includes forming dielectric layers 124A2 and forming conductive patterns 124A1 in/on the dielectric layers 124A2, where the dielectric layers 124A2 and the conductive patterns 124A1 are alternately stacked over the first side 121a of the core layer 121. Similarly, the formation of the second build-up structure 124B may include forming dielectric layers 124B2 and conductive patterns 124B1 in/on the dielectric layers 124B2, where the dielectric layers 124B2 and the conductive patterns 124B1 are alternately stacked over the second side 121b of the core layer 121. More or fewer dielectric layers and conductive patterns may be formed in the first and second build-up structures 124A and 124B than shown in FIG. 3A.

The conductive patterns 124A1 and 124B1 may each include conductive vias, conductive lines, conductive pads, and/or the like, and may include conductive material(s) such as copper, gold, tungsten, aluminum, silver, gold, alloy, a combination thereof, and/or the like. In some embodiments, the conductive vias of the conductive patterns 124A1 and 124B1 are tapered in opposing directions. For example, the conductive vias of the conductive patterns 124A1 are tapered from the first build-up structure 124A toward the second build-up structure 124B, and the conductive vias of the conductive patterns 124B1 are tapered from the second build-up structure 124B toward the first build-up structure 124A. The dielectric layers 124A2 and 124B2 may include ABF, prepreg, resin coated copper foil (RCC), polyimide, photo-image-dielectric (PID), solder resist material, molding compound, a combination thereof, and/or the like, and may be formed by a lamination process, a coating process, or the like.

With continued reference to FIG. 3A, the outermost layers of the conductive patterns 124A1 and 124B1 may each, respectively, include under-bump metallization (UBM) pads 124AP and 124BP for external connections. The outermost layers of the dielectric layers 124A2 and 124B2 may each, respectively, include resist sublayers 124AR and 124BR covering the corresponding UBM pads 124AP and 124BP. For example, the resist sublayer 124AR laterally covers the respective UBM pad 124AP and may (or may not) extend to partially cover the lower surface of the respective UBM pad 124AP which faces the redistribution structure 110. The resist sublayer 124BR may laterally cover the respective UBM pad 124BP and may (or may not) extend to partially cover the upper surface of the respective UBM pad 124BP. In some embodiments, a lateral dimension D1 of the conductive pads 1112ap of the redistribution structure 110 is less than a lateral dimension D2 of the UBM pads 124AP of the substate component 120.

In some embodiments, the substrate component 120 further includes bump portions 124A3 formed on the UBM pads 124AP with a one-to-one correspondence. The bump portions 124A3 and the bump portions 1113 may be of the same (or similar) material. The bump portions 124A3 may be formed by: forming a layer of solder on the respective UBM pad 124AP through evaporation, electroplating, printing, solder transfer, ball placement, or the like; and performing a reflow process to shape the solder material into the desired bump shapes. The bump portions 124A3 may be (or include) BGA connectors, solder balls, C4 bumps, micro bumps, ENEPIG bumps, and/or the like.

Still referring to FIG. 3A, before disposing the substrate component 120 on the redistribution structure 110, a buffer material 90' may be formed on the first portion 111 of the redistribution structure 110 to cover one or more region(s) of the bump portions 1113. For example, the buffer material 90' is formed on the stress region SR1 by any suitable technique, such as screen printing, spray coating, jetting, dipping, spin coating, combinations thereof, and/or the like. The region beside the stress region SR1 may be free of the buffer material 90' formed thereon. In some embodiments, the bump portions 124A3 of the substrate component 120 are disposed on the bump portions 1113 of the redistribution structure 110 with a one-to-one correspondence after the formation of the buffer material 90'. As shown in the enlarged view of FIG. 3A, the buffer material 90' may surround the bump portion 1113 and the underlying conductive pad 1112*ap* and also partially (or fully) cover the overlying bump portion 124A3. The coverage of the bump portion 124A3 may vary depending on the amount of the buffer material 90' applying to the redistribution structure 110.

In some embodiments, the buffer material 90' includes a flux material with an organic polymer material. The flux material (or reflowable material) may include activators, solvents, and/or additives. For example, the flux material facilitates solder joint formation and does not exist after the subsequently-performed reflow process. The organic polymer material may be left on the dielectric layer 1112*b* of the redistribution structure 110 after the subsequently-performed reflow process and may serve as a stress-relief layer to prevent the underlying dielectric layer 1112*b* from cracking. The organic polymer material may be (or include) an epoxy. For example, the buffer material 90' is polymer flux (e.g., epoxy flux or the like). In some embodiments, the buffer material 90' is free of fillers. The buffer material 90' may include any suitable material that can facilitate soldering and relieving the stresses in the underlying dielectric layer 1112*b*.

Figures 3B, 3C, 3D:
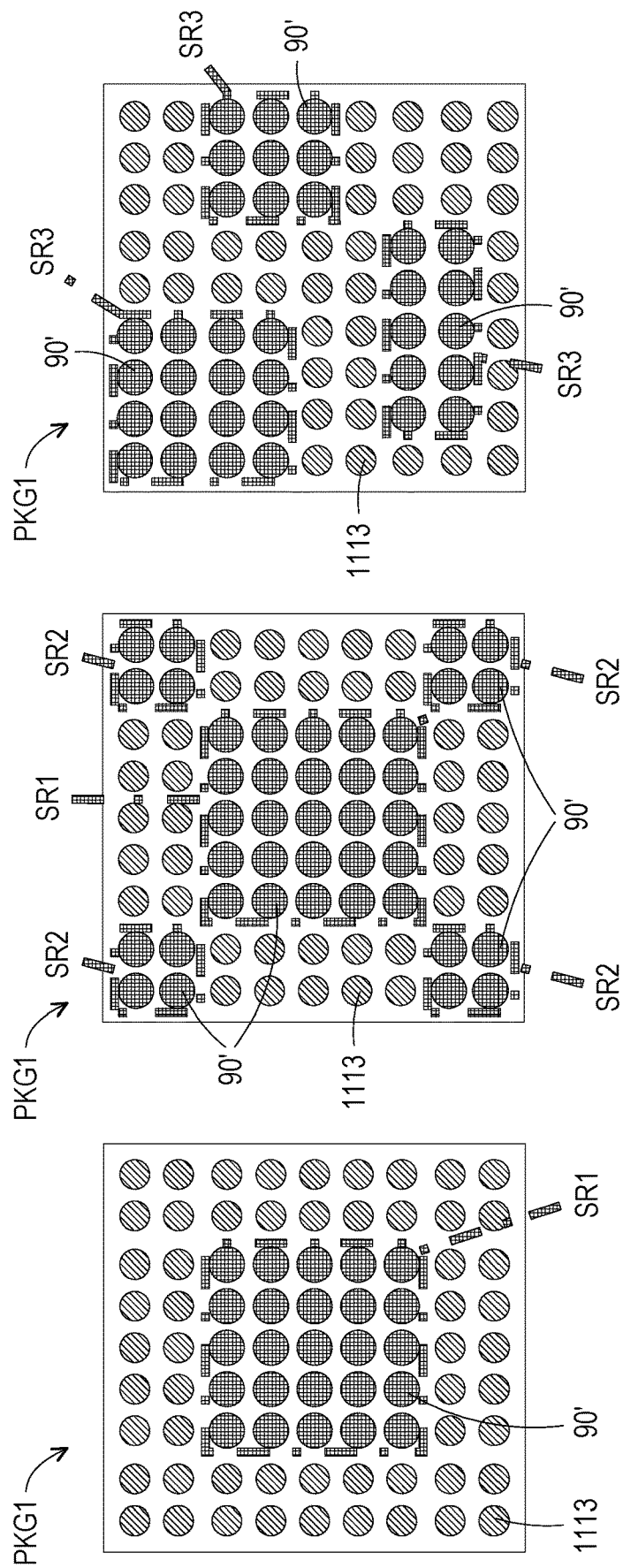

Referring to FIG. 3B and with reference to FIG. 3A, the structure of FIG. 3B shows the buffer material 90' formed to cover the bump portions 1113 within the stress region SR1. In some embodiments, the stress region SR1 is located on the center of the package region PKG1. For example, the stress region SR1 is the region right below the subsequently-mounted package component. In some embodiments, the stresses causing cracking of the dielectric layer in the redistribution structure 110 has been observed to be greatest at the region corresponding to the subsequently-mounted package component, where the subsequently-mounted package component will be located on the center of the package region PKG1. Forming the buffer material 90' on the bump portions 1113 within the stress region SR1 may relieve the stresses in the underlying dielectric layer within the stress region SR1, reducing cracking of the dielectric layer. In some embodiments, the bump portions 1113 in the region other than the stress region SR1 may be covered by flux material (not shown; without polymer material) for facilitating the subsequently-performed solder joint formation.

Referring to FIGS. 3C-3D and with reference to FIG. 3B, the structures of FIGS. 3C-3D show different configurations of the stress regions. Depending on the results of stress simulation or experimental data, the buffer material 90' may be formed on a plurality of stress regions (e.g., SR1 and SR2). In some embodiments, the stresses causing cracking of the dielectric layer in the redistribution structure 110 has been observed to be greatest not only at the region corresponding to the subsequently-mounted package component but also at the corner regions SR2 of the package region PKG1. The buffer material 90' may then be formed on the center and corner regions (e.g., SR1 and SR2) as shown in FIG. 3C. In some embodiments, one of the stress regions SR3 is located at the corner of the package region PKG1, another one of the stress regions SR3 is located in proximity to the edge of the package region PKG1, and the other one of the stress regions SR3 is located between the aforementioned two stress regions as shown in FIG. 3D. It should be understood that the configurations of various stress regions illustrate here are merely examples, and other configurations are fully intended to be included within the scope of the disclosure.

Figure 4A:
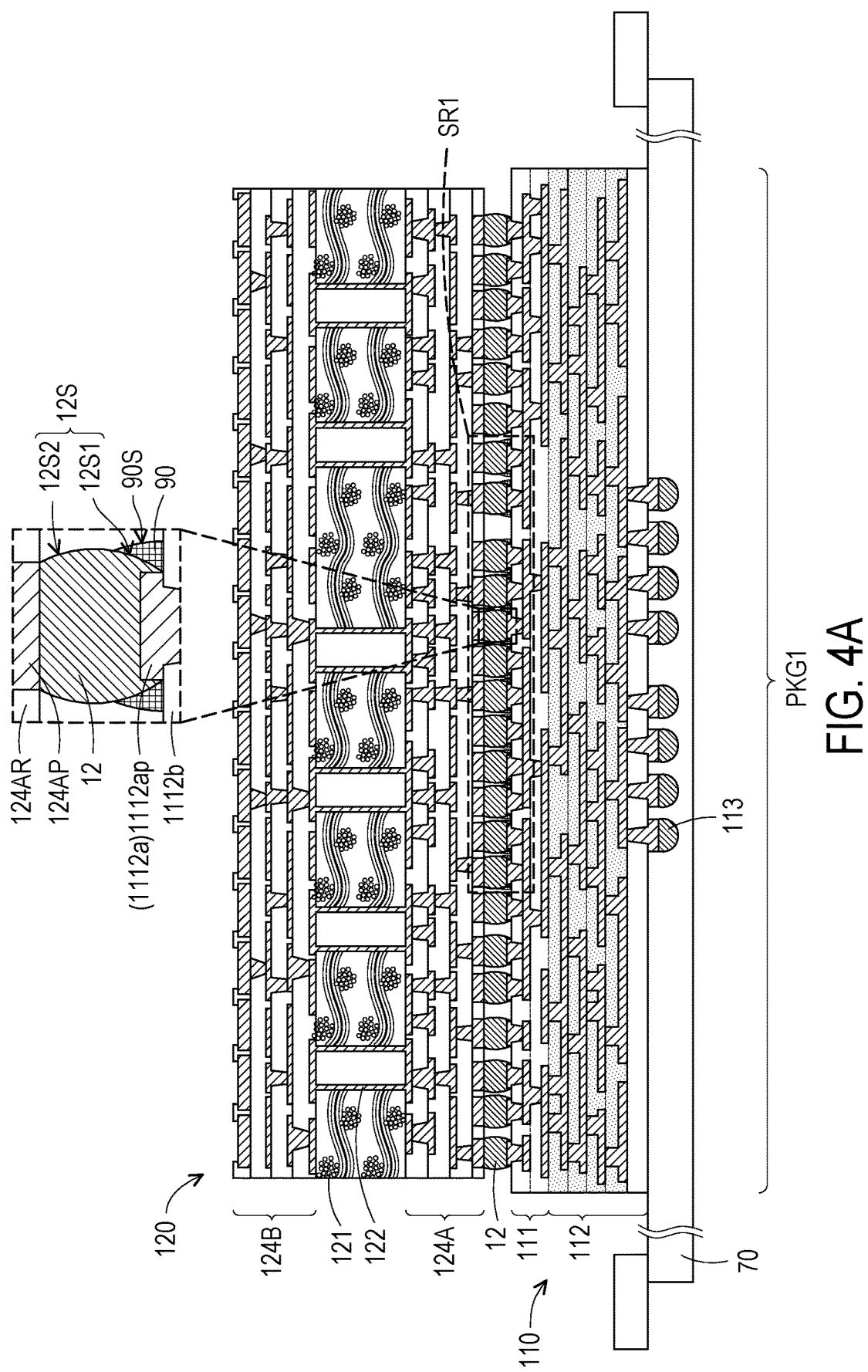

Referring to FIG. 4A and with reference to FIG. 3A, after contacting the bump portions 124A3 of the substrate component 110 with the bump portions 1113 and the buffer material 90', a reflow process may be performed. For example, the bump portions 124A3 and 1113 are heated such that the bump portions 124A3 and the corresponding bump portions 1113 bond with each other and form a physical and electrical bond. For example, the reflow process reflows the bump portions 124A3 and 1113, and then the bump portions 124A3 and 1113 become first conductive joints 12 (e.g., solder joints). In some embodiments, pressure may also be applied to the bump portions 124A3 and 1113 downwardly to the tape frame 70. In some embodiments, the reflow process is performed at a temperature suitable to melt the solder material, such as between about 240° C. and about 260° C. The reflow process may be performed for a time sufficient to cure the bump portions 124A3 and 1113 and the buffer material 90', such as between about 2 minutes to about 3 minutes. The temperature and the duration of the reflow may be determined by the composition of the bump portions 124A3 and 1113, and other temperature profiles and duration are also possible.

During the reflow process, the flux material in the buffer material 90' may facilitate the soldering of the bump portions 1113 to the bump portions 124A3 to form the first conductive joints 12. In some embodiments, the flux material in the buffer material 90' (e.g., substantially) entirely evaporates during the soldering process. In alternative embodiments, a detrimental amount of the flux material may be left, and a cleaning process is performed to remove the remaining portion of the flux material after the reflow process. For example, the conductive joint 12 substantially covers the entirety of the lower surface of the UBM pad 124AP which is exposed by the resist sublayer 124AR and also substantially covers the entireties of the upper surface and the sidewall of the conductive pads 1112*ap* which is protruded from the dielectric layer 1112*b*. In some embodiments, after the reflow process, at least a portion of the polymer material in the buffer material 90' is left remaining on the dielectric layer 1112*b* of the redistribution structure 110 to form a buffer layer 90, as shown in the enlarged view of FIG. 4A. The buffer layer 90 left remaining surrounds the respective first conductive joint 12, protecting and strengthening the respective first conductive joint 12 and the underlying dielectric layer 1112*b* of the redistribution structure 110.

As shown in the enlarged cross sectional view of FIG. 4A, the buffer layer 90 is formed on the top surface of the dielectric layer 1112*b* of the redistribution structure 110 and may extend upwardly to cover a first portion 12S1 of an outer surface 12S of the respective first conductive joint 12. For example, a second portion 12S2 of the outer surface 12S connected to the first portion 12S1 and the UBM pad 124AP is accessibly revealed by the buffer layer 90. The buffer layer 90 may have the curved outer surface 90S. In some embodiments, the curved outer surface 90S of the buffer layer 90 is the convex surface oriented toward the substrate component 120. For example, the thickness of the buffer layer 90 (e.g., gradually) decreases from the bottom to the top of the first portion 12S1 of the outer surface 12S of the respective first conductive joint 12. The ratio of the first portion 12S1 to the second portion 12S2 and the thickness of the buffer layer 90 may vary depending on process recipes.

Figure 4B:
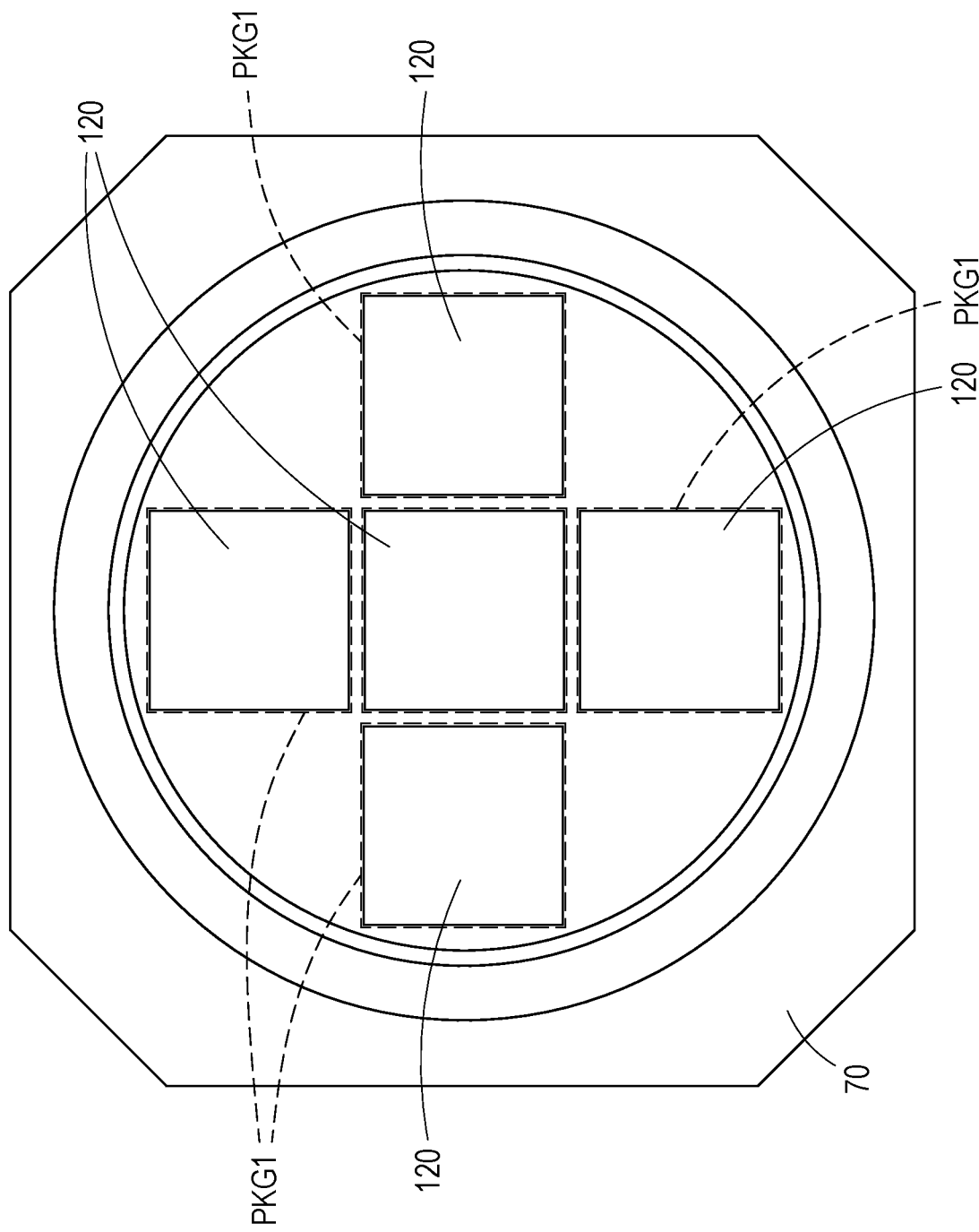

Referring to FIG. 4B and with reference to FIG. 4A, in the top view, a plurality of substrate components 120 may be disposed on the package regions PKG1 with a one-to-one correspondence, and each of the substrate components 120 may be coupled to the redistribution structure 110 of one of the package regions PKG1, in accordance with some embodiments. Other configurations are fully intended to be included within the scope of the disclosure.

Figure 5A:
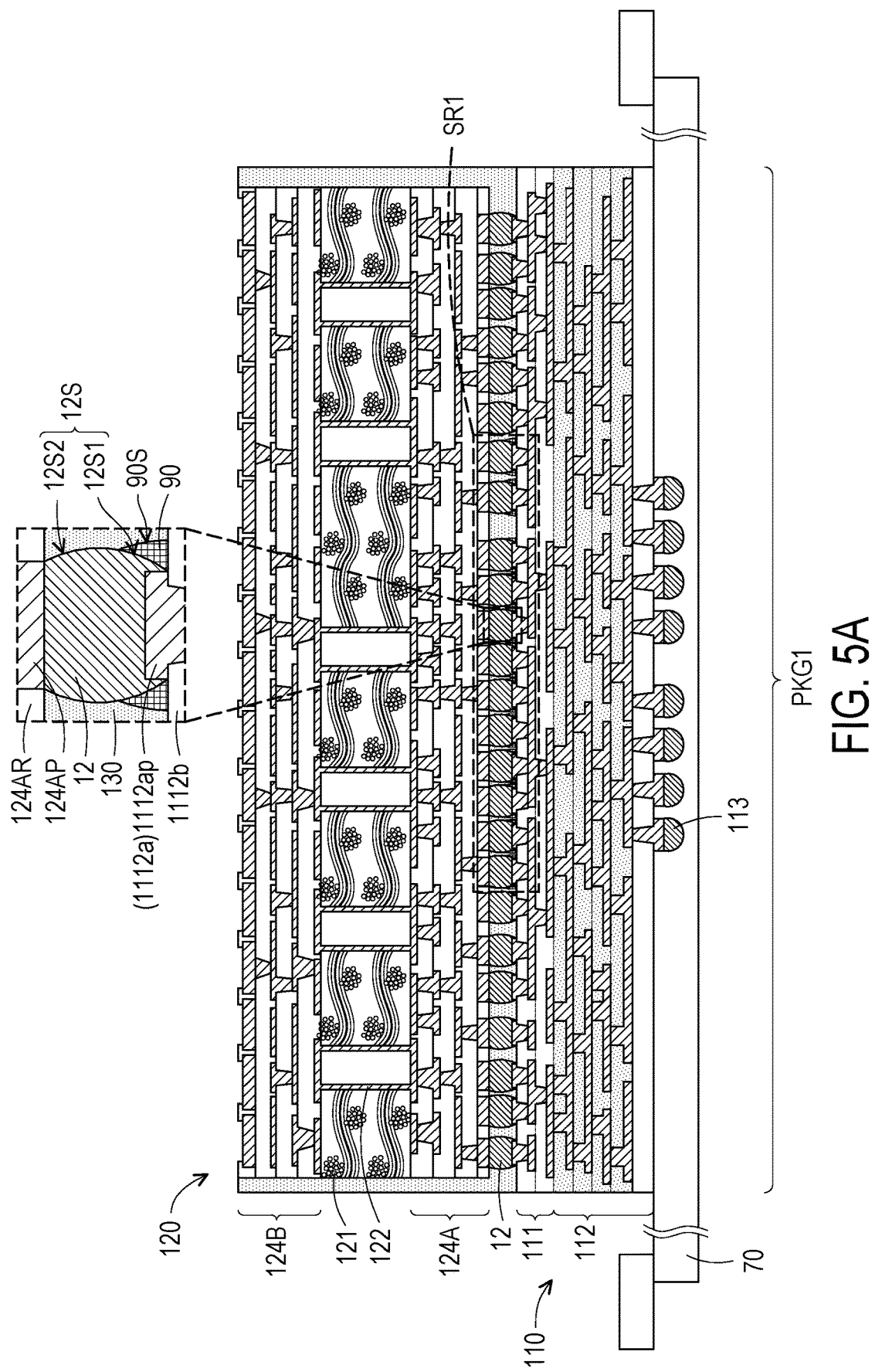
Figure 5B:
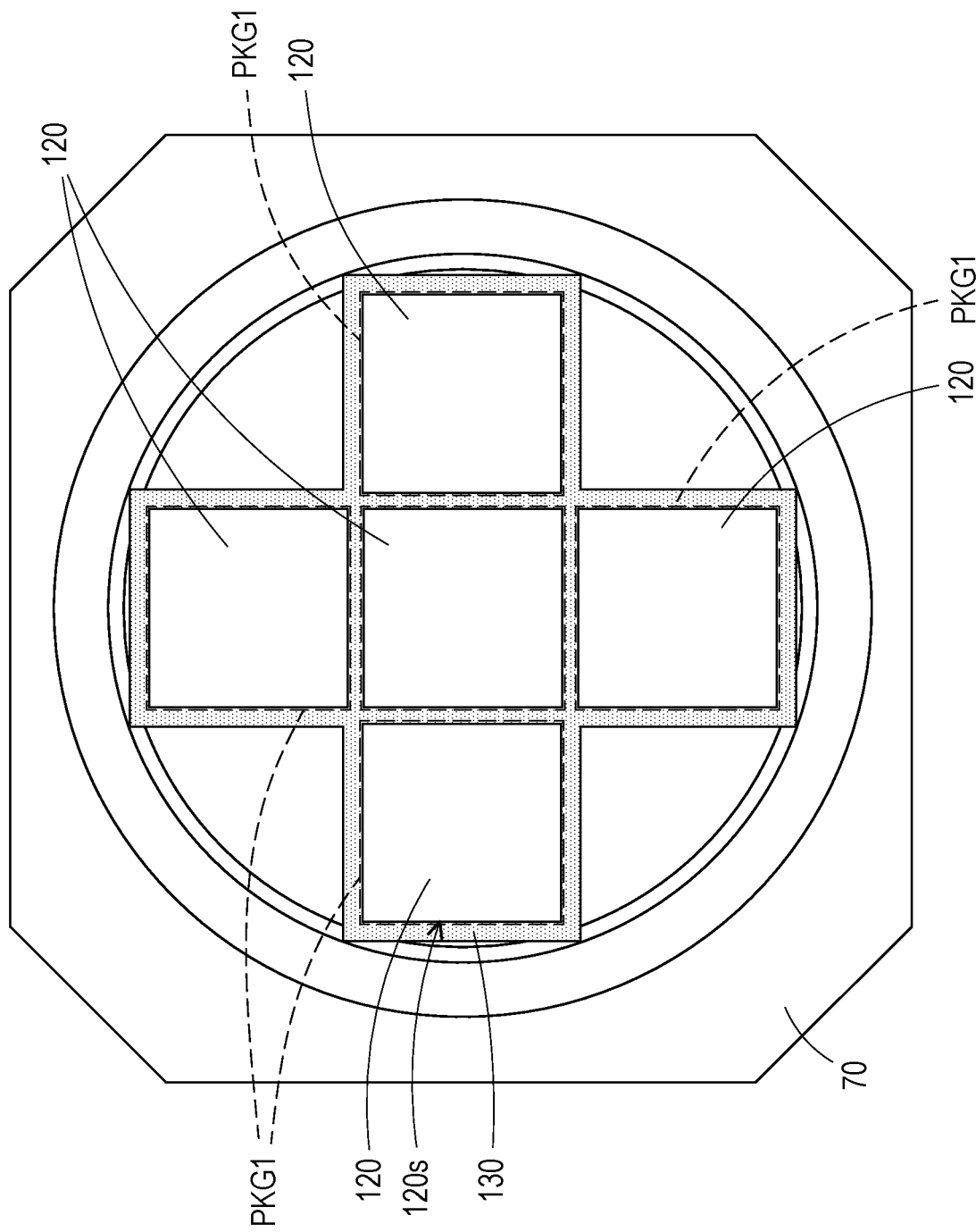

Referring to FIGS. 5A-5B, an insulating encapsulation 130 may be formed on the redistribution structure 110 to encapsulate the substrate component 120. The insulating encapsulation 130 may be (or include) molding compound, molded underfill, polymer such as polyimide, PBO, BCB, ABF, or other suitable encapsulating materials, and may be formed compression molding, transfer molding, or other suitable deposition methods. For example, an insulating material is formed over the tape frame 70 in each of the package regions PKG1, such that each of the substrate components 120 over the tape frame 70 may be buried or covered. The insulating encapsulation 130 may be applied in liquid or semi-liquid form and then subsequently cured. A planarization process and/or a cleaning process may be performed, if necessary, on the insulating material to form the insulating encapsulation 130 that accessibly exposes the UBM pads 124BP of the substrate component 120. In some embodiments, the planarization process is omitted, if the UBM pads 124BP are already exposed. Other processes may be used to achieve a similar result.

The insulating encapsulation 130 may cover at least a portion of the sidewall 120s of the substrate component 120. In some embodiments, the insulating encapsulation 130 covers the entirety of the sidewall 120s of the substrate component 120, where the sidewall 120s includes outer sidewalls of the core layer 121 and the first and second build-up structures 1240A and 124B. The insulating encapsulation 130 may also be formed in the gap between and the redistribution structure 110 and the substrate component 120 to securely bond the associated elements and provide structural support and environmental protection. For example, the insulating encapsulation 130 surrounds the first conductive joints 12, the buffer layer 90, and the exposed surfaces of dielectric layer 1112b of the redistribution structure 110 and the resist sublayer 124AR of the substrate component 120. As shown in the enlarged cross-sectional view of FIG. 5A, the insulating encapsulation 130 may be in physical contact with the second portion 12S2 of the outer surface 12S of the conductive joint 12 and the curved outer surface 90S of the buffer layer 90, and the buffer layer 90 separates the first portion 12S1 of the conductive joint 12 from the insulating encapsulation 130. In some embodiments, the insulating encapsulation 130 includes fillers (not shown), while the buffer layer 90 is free of fillers. Alternatively, both of the insulating encapsulation 130 include fillers.

The insulating encapsulation 130, the substrate component 120, and the redistribution structure 110 may each have a different coefficient of thermal expansion (CTE). Thermal processes (e.g., application of the insulating encapsulation 130) may cause the different elements to expand at different rates under the heating of the thermal processing, possibly causing the dielectric layer 1112b of the redistribution structure 110 to form cracks. In some embodiments, the stresses causing cracking has been observed to be greatest at the stress region SR1. The thermal stress tends to cause cracking in the stress region SR1, particularly at the certain locations of the dielectric layer 1112b that interface the conductive pad 1112ap and the overlying conductive joint 12. Forming the buffer layer 90 on the stress region SR1 relieves the stresses in the dielectric layer 1112b, reducing cracking of the dielectric layer 1112b.

Figure 6:
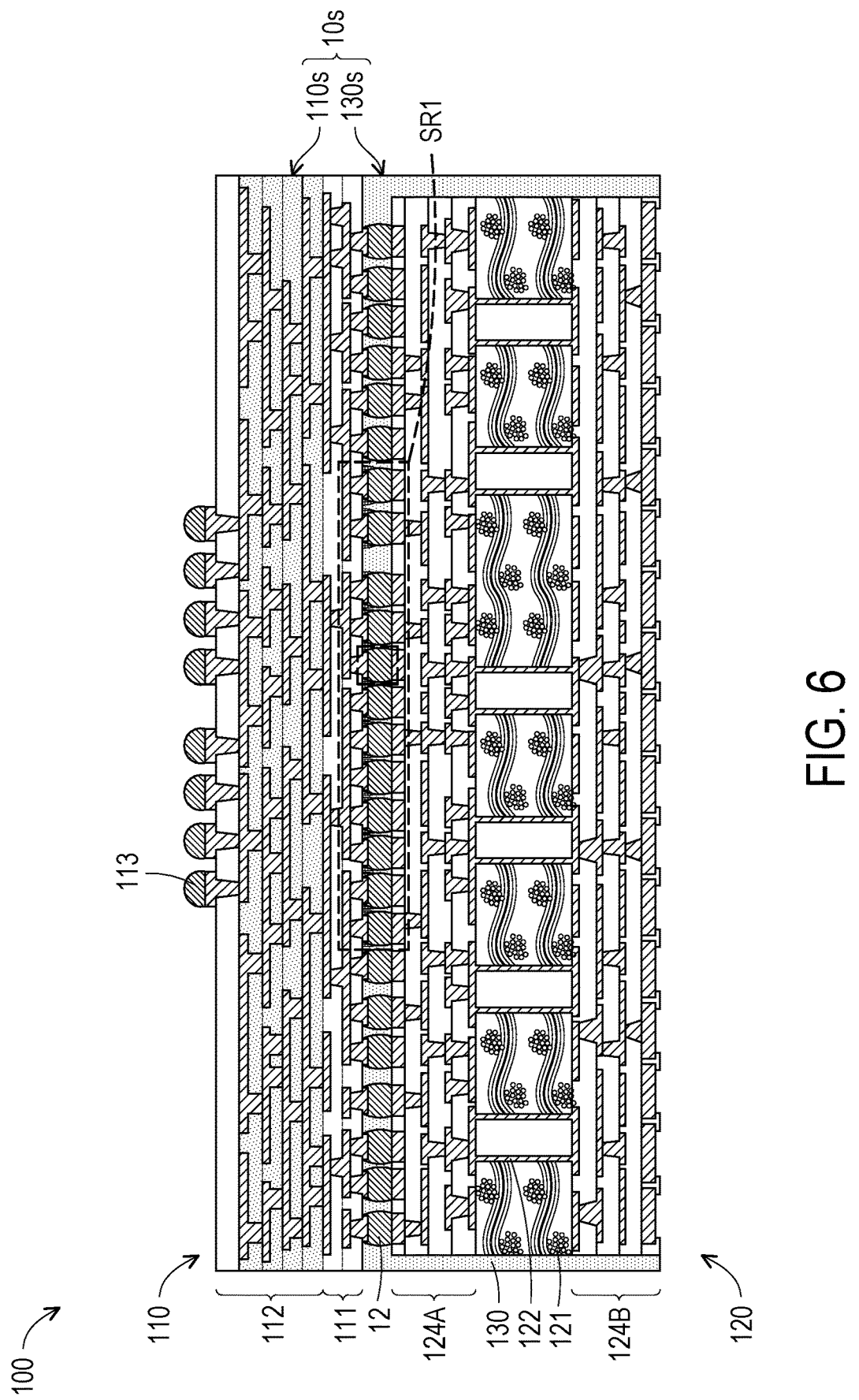

Referring to FIG. 6 and with reference to FIGS. 5A-5B, after forming the insulating encapsulation 130, a singulation process may be performed over the tape frame 70 to separate the package regions PKG1 from one another so as to form individual integrated substrate 100. For example, the insulating encapsulation 130 and the underlying dielectric layers of the redistribution structure 110 are cut through to form the integrated substrate 100 having a coterminous sidewall 10s, where the coterminous sidewall 10s includes the sidewall 130s of the insulating encapsulation 130 and the sidewall 110s of the redistribution structure 110 substantially leveled with each other. After the singulation process, the integrated substrate 100 may be removed from the tape frame 70 through a de-taping process in order to accessibly expose the bump portions 113 of the redistribution structure 110 for further processing.

Figure 7:
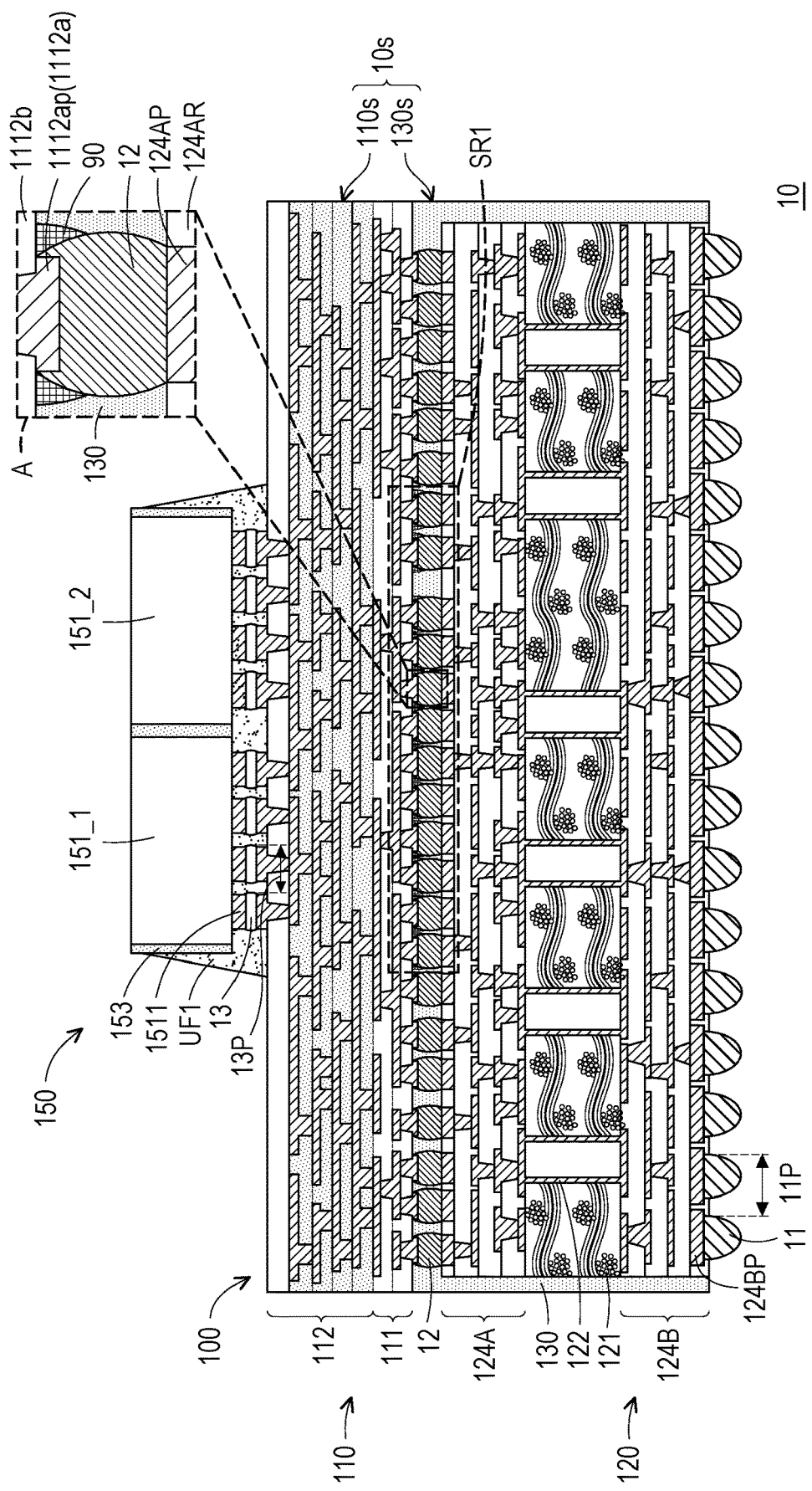

Referring to FIG. 7, at least one package component 150 may be mounted on the integrated substrate 100. The package component 150 may be (or include) integrated fan-out package component, chip-on-wafer-on-substrate package component, silicon package component, and/or the like. For example, the package component 150 includes one or more semiconductor die (e.g., 151_1 and 151_2) laterally covered by an encapsulant 153 and electrically coupled to the integrated substrate 100, and the die connectors 1511 of the respective semiconductor dies (e.g., 151_1 and 151_2) are coupled to the integrated substrate 100 through second conductive joints 13 (e.g., solder joints). For example, the cap portions (not shown) of the die connectors 1511 of the semiconductor dies (151_1 and 151_2) are disposed on the bump portions 113 of the redistribution structure 110, and then the cap portions and the bump portions 113 are reflowed to form the second conductive joints 13 coupling the die connectors 1511 of the semiconductor dies (151_1 and 151_2) to the second portion 112 of the redistribution structure 110. The second conductive joints 13 may provide electrical connection between the semiconductor dies (151_1 and 151_2) and the underlying integrated substrate 100.

It should be noted that although two semiconductor dies (151_1 and 151_2) illustrated herein are merely examples, and the package component may include a single semiconductor die or more than two semiconductor dies, depending on product requirements. The semiconductor dies (151_1 and 151_2) may be the same type of dies. Alternatively, the semiconductor dies (151_1 and 151_2) are different types of dies. The semiconductor dies (151_1 and 151_2) may be (or include) logic dies (e.g., central processing unit (CPU), graphics processing unit (GPU), system-on-a-chip (SoC), application processor (AP), microcontroller, etc.), one or more memory dies (e.g., dynamic random access memory (DRAM) dies, static random access memory (SRAM) dies, High Bandwidth Memory (HBM) dies, etc.), one or more power management dies (e.g., power management integrated circuit dies), one or more radio frequency (RF) dies, one or more sensor dies, one or more micro-electro-mechanical-system (MEMS) dies, one or more signal processing dies (e.g., digital signal processing (DSP) die), one or more front-end dies (e.g., analog front-end (AFE) dies), one or more input/output (I/O) dies, the like, or combinations thereof.

The encapsulant 153 may extend along the sidewalls of the respective semiconductor die (151_1 and 151_2) for protection. The encapsulant 153 may be a material such as a molding compound, an epoxy, an underfill, a molding underfill, a resin, or the like, and may be formed by molding process or any suitable deposition process. In some embodiments, the encapsulant 153 and the insulating encapsulation 130 are of the same material. In some embodiments, an underfill layer UF1 is formed in a gap between the semiconductor dies (151_1 and 151_2) and the second portion 112 of the redistribution structure 110 to surround the die connectors 1511 of the semiconductor dies (151_1 and 151_2), the second conductive joints 13, and the conductive pattern of the redistribution structure 110 in order to provide structural support and environmental protection. The underfill layer UF1 may reduce stress and protect the joints resulting from the reflowing of the second conductive joints 13. The underfill layer UF1 may extend to partially or completely cover the sidewalls of the encapsulant 153. Alternatively, the underfill layer UF1 is omitted.

With continued reference to FIG. 7, external terminals 11 may be formed on the UBM pads 124BP of the substrate component 120 to form a package structure 10. The external terminals 11 may include a conductive material such as solder, copper, aluminum, gold, nickel, silver, palladium, tin, alloy, the like, or a combination thereof. The external terminals 11 may be BGA connectors, solder balls, metal pillars, C4 bumps, micro bumps, and/or the like. In some embodiments, the external terminals 11 of the package structure 10 are bonded to a circuit carrier (e.g., a system board, a printed circuit board, or the like) for electrical connections to other external devices or electronic components.

The critical dimension of the external terminals 11 may be greater than the critical dimension of the first conductive joints 12, and the critical dimension of the first conductive joints 12 may be greater than the critical dimension of the second conductive joints 13. By way of example and not limitation, the critical dimension of the respective external terminal 11 is about 500 μm, the critical dimension of the respective first conductive joint 12 is about 250 μm, and the critical dimension of the respective second conductive joint 13 is about 130 μm. In a given area, the density of the external terminals 11 may be less than that of the first conductive joints 12, and the density of the first conductive joints 12 may be less than that of the second conductive joints 13. For example, the pitch 11P of the adjacent external terminals 11 is greater than the pitch 12P of the adjacent first conductive joints 12, and the pitch 12P of the adjacent first conductive joints 12 is greater than the pitch 13P of the adjacent second conductive joints 13. By way of example and not limitation, the pitch 11P is about 1000 μm, the pitch 12P is about 500 μm, and the pitch 13P is about 130 μm. Other values are fully intended to be included within the scope of the disclosure.

As shown in the enlarged cross-sectional view of the dashed box A in FIG. 7, the integrated substrate 100 includes the buffer layer 90 disposed on the dielectric layer 1112b of the redistribution structure 110 and may extend downwardly to partially cover the first conductive joint 12. The rest portion of the first conductive joint 12 which is not covered by the buffer layer 90 may be in physical contact with the insulating encapsulation 130. Forming the buffer layer 90 on the dielectric layer 1112b of the redistribution structure 110 within the stress region SR1 relieves the stresses in the dielectric layer 1112b, reducing cracking of the dielectric layer 1112b.

FIGS. 8A-8B are schematic and enlarged cross-sectional views of variations of the structure outlined in the dashed box A of FIG. 7, in accordance with some embodiments. The same reference numerals are used to refer to the same and similar parts.

Referring to FIG. 8A and with reference to FIG. 7, in some embodiments, the minimum spacing 12SP between two adjacent first conductive joints 12 is sufficiently large, the buffer layer 90 covering the right-hand side of the first conductive joint 12 is separated from the buffer layer 90 covering the left-hand side of the first conductive joint 12 through the insulating encapsulation 130. For example, a portion of the insulating encapsulation 130 interposed between these two adjacent first conductive joints 12 is in direct contact with the dielectric layer 1112b of the redistribution structure 110, the outer surface 90S of the buffer layer 90, and the resist sublayer 124AR of the substrate component 120. The portion of the insulating encapsulation 130 interposed between these two adjacent first conductive joints 12 may have the thickness increasing from the dielectric layer 1112b of the redistribution structure 110 to the resist sublayer 124AR of the substrate component 120.

Referring to FIG. 8B and with reference to FIG. 8A, in some embodiments, the minimum spacing 12SP' between two adjacent first conductive joints 12 is insufficiently large, a portion of the buffer layer 90 interposed between these two adjacent first conductive joints 12 forms a coterminous outer surface 90S'. For example, the outer surface 90S' is a curved surface convex toward the resist sublayer 124AR of the substrate component 120. A portion of the insulating encapsulation 130 interposed between these two adjacent first conductive joints 12 may be in physical contact with the outer surface 90S' of the buffer layer 90.

In accordance with some embodiments, a package structure includes an integrated substrate and a package component. The integrated substrate includes a substrate component laterally covered by an insulating encapsulation, a redistribution structure disposed over the substrate component and the insulating encapsulation, first conductive joints coupling the redistribution structure to the substrate component, and a buffer layer disposed on a lowermost dielectric layer of the redistribution structure and extending downwardly to cover an upper portion of each of the first conductive joints. A lower portion of each of the first conductive joints connected to the upper portion is covered by the insulating encapsulation. The package component disposed over and electrically coupled to the redistribution structure includes a semiconductor die laterally covered by an encapsulant.

In accordance with some embodiments, a package structure includes an integrated substrate. The integrated substrate includes a substrate component, a redistribution structure, first and second conductive joints, a buffer layer, and an insulating encapsulation. The substrate component includes a core layer, a first build-up structure and a second build-up structure disposed on opposite sides of the core layer and electrically coupled to each other by through core vias penetrating through the core layer. The redistribution structure includes a first portion disposed over and electrically coupled to the first build-up structure of the substrate component, and a second portion stacked on and electrically coupled to the first portion. The first and second conductive joints are disposed between and electrically connected to the first portion of the redistribution structure and the first build-up structure of the substrate component. The buffer layer is disposed on a lowermost dielectric layer of the first portion of the redistribution structure and partially covers the first conductive joints. The insulating encapsulation is interposed between the lowermost dielectric layer of the first portion of the redistribution structure and the first build-up structure of the substrate component to cover the buffer layer, the first conductive joints and the second conductive joints, and the insulating encapsulation extends along a sidewall of the substrate component.

In accordance with some embodiments, a forming method of a package structure includes: forming a redistribution structure, wherein the redistribution structure comprises first bump portions formed over an outermost dielectric layer; forming a buffer material on the outermost dielectric layer, wherein the buffer material comprises a reflowable material and a polymer material; disposing a substrate component on the redistribution structure after forming the buffer material, where second bump portions of the substrate component are in contact with the first bump portions of the redistribution structure, and the buffer material covers the first and second bump portions; reflowing the first and second bump portions to form conductive joints coupled to the redistribution structure and the substrate component, where after the reflowing, the polymer material of the buffer material remains on the outermost dielectric layer to form a buffer layer partially covering the conductive joints; and forming an insulating encapsulation on the redistribution structure to laterally cover the substrate component, where the insulating encapsulation extends into a gap between the redistribution structure and the substrate component to cover the buffer layer and a portion of the conductive joints that is not covered by the buffer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   an integrated substrate comprising:
      a substrate component laterally covered by an insulating encapsulation;
      a redistribution structure disposed over the substrate component and the insulating encapsulation;
      first conductive joints coupling the redistribution structure to the substrate component; and
      a buffer layer disposed on a lowermost dielectric layer of the redistribution structure and extending downwardly to cover an upper portion of each of the first conductive joints, wherein a lower portion of each of the first conductive joints connected to the upper portion is covered by the insulating encapsulation, and a portion of the buffer layer interposed between adjacent two of the first conductive joints has a coterminous outer surface connected between the adjacent two of the first conductive joints, and the insulating encapsulation is in contact with the coterminous outer surface of the portion of the buffer layer; and
   a package component disposed over and electrically coupled to the redistribution structure, the package component comprising a semiconductor die laterally covered by an encapsulant.

2. The package structure of claim 1, wherein in a cross section, a thickness of the buffer layer increases from an interface between the lowermost dielectric layer of the redistribution structure and the upper portion of the respective first conductive joint to an interface between the upper portion and the lower portion of the respective first conductive joint.

3. The package structure of claim 1, wherein a portion of the insulating encapsulation covers the buffer layer, and the buffer layer comprises a curved outer surface convex toward the portion of the insulating encapsulation.

4. The package structure of claim 1, wherein the first conductive joints are disposed on a stress region right below the package component.

5. The package structure of claim 1, wherein the buffer layer comprises a flux material with a polymeric material.

6. The package structure of claim 1, wherein a sidewall of the substrate component is covered by the insulating encapsulation, and a sidewall of the insulating encapsulation is substantially aligned with a sidewall of the redistribution structure.

7. The package structure of claim 1, wherein the redistribution structure comprises:
   a first portion comprising the lowermost dielectric layer, lowermost conductive vias penetrating through the lowermost dielectric layer, and lowermost conductive pads connected to the lowermost conductive vias and protruded from the lowermost dielectric layer, wherein the first conductive joints cover the lowermost conductive pads; and
   a second portion stacked on the first portion and comprising uppermost conductive vias, wherein the uppermost conductive vias are tapered toward the first portion, and the uppermost and lowermost conductive vias are tapered toward opposing directions.

8. The package structure of claim 1, further comprising:
   second conductive joints coupling the semiconductor die to the redistribution structure, wherein the first and second conductive joints are of solder material, and a critical dimension of the first conductive joints is greater than a critical dimension of the second conductive joints.

9. The package structure of claim 1, wherein the substrate component comprises:
   a core layer;
   a first build-up structure and a second build-up structure disposed on opposing sides of the core layer, wherein the first conductive joints are bonded to outermost conductive pads of the first build-up structure; and
   through core vias penetrating through the core layer and coupled to the first and second build-up structures.

10. A package structure, comprising:
    an integrated substrate comprising:
       a substrate component comprising a core layer, a first build-up structure and a second build-up structure disposed on opposite sides of the core layer and electrically coupled to each other by through core vias penetrating through the core layer;
       a redistribution structure comprising a first portion disposed over and electrically coupled to the first build-up structure of the substrate component, and a second portion stacked on and electrically coupled to the first portion;
       first and second conductive joints disposed between and electrically connected to the first portion of the redistribution structure and the first build-up structure of the substrate component;

a buffer layer disposed on a lowermost dielectric layer of the first portion of the redistribution structure and partially covering the first conductive joints; and an insulating encapsulation interposed between the lowermost dielectric layer of the first portion of the redistribution structure and the first build-up structure of the substrate component to cover the buffer layer, the first conductive joints and the second conductive joints, and the insulating encapsulation extending along a sidewall of the substrate component; and a package component disposed over and electrically coupled to the second portion of the redistribution structure, the package component comprising a semiconductor die laterally covered by an encapsulant, wherein the first conductive joints are disposed on a stress region right below the package component, and the second conductive joints are disposed on a region other than the stress region.

11. The package structure of claim 10, wherein the buffer layer comprises a flux material with a polymeric material.

12. The package structure of claim 10, wherein:
the buffer layer is in physical contact with a portion of a lower surface of the lowermost dielectric layer of the first portion of the redistribution structure and a portion of an outer surface of the respective first conductive joint, and
the insulating encapsulation is in physical contact with the other portion of the lower surface of the lowermost dielectric layer of the first portion of the redistribution structure and the other portion of the outer surface of the respective first conductive joint.

13. The package structure of claim 10, wherein the insulating encapsulation is in physical contact with an entirety of an outer surface of the respective second conductive joint and a portion of the outer surface of the respective first conductive joint that is not covered by the buffer layer.

14. The package structure of claim 10, wherein a first portion of the buffer layer covering one of the first conductive joints and a second portion of the buffer layer covering adjacent one of the first conductive joints are isolated from each other through a portion of the insulating encapsulation.

15. The package structure of claim 14, wherein in a cross section, the portion of the insulating encapsulation has a thickness increasing from an interface between the lowermost dielectric layer of the redistribution structure and the buffer layer toward an outermost dielectric layer of the first build-up structure.

16. The package structure of claim 10, wherein the buffer layer has a curved outer surface convex from the lowermost dielectric layer of the first portion of the redistribution structure toward the insulating encapsulation that covers the buffer layer.

17. A package structure, comprising:
an integrated substrate comprising:
a redistribution structure comprising:
a first portion comprising a lowermost dielectric layer, lowermost conductive vias penetrating through the lowermost dielectric layer, and lowermost conductive pads connected to the lowermost conductive vias and protruded from the lowermost dielectric layer; and
a second portion stacked on the first portion and comprising uppermost conductive vias, wherein the uppermost conductive vias are tapered toward the first portion, and the uppermost and lowermost conductive vias are tapered toward opposing directions;
a substrate component coupled to the redistribution structure through conductive joints, wherein the respective conductive joint comprises a first portion connected to the redistribution structure and a second portion connecting the first portion to the substrate component, and the conductive joints cover the lowermost conductive pads; and
a buffer layer disposed on a dielectric layer the redistribution structure and extending to cover the first portion of the respective conductive joint, wherein in a cross section, a thickness of the buffer layer decreases from an interface between the dielectric layer of the redistribution structure and the first portion of the respective conductive joint to an interface between the first portion and the second portion of the respective conductive joint.

18. The package structure of claim 17, wherein the integrated substrate further comprises:
an insulating encapsulation laterally covering the substrate component, wherein the second portion of the respective conductive joints are laterally covered by the insulating encapsulation.

19. The package structure of claim 17, wherein the buffer layer is free of fillers and the insulating encapsulation comprises fillers.

20. The package structure of claim 17, further comprising:
a package component electrically coupled to the redistribution structure, the package component comprising a semiconductor die laterally covered by an encapsulant.

* * * * *